United States Patent
Kadobe (10) Patent No.: US 11,581,198 B2
(45) Date of Patent: Feb. 14, 2023

(54) PROCESSING APPARATUS

(71) Applicant: TOKYO ELECTRON LIMITED, Tokyo (JP)

(72) Inventor: Masato Kadobe, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 310 days.

(21) Appl. No.: 16/736,241

(22) Filed: Jan. 7, 2020

(65) Prior Publication Data
US 2020/0227287 A1   Jul. 16, 2020

(30) Foreign Application Priority Data
Jan. 10, 2019   (JP) .............................. JP2019-002944

(51) Int. Cl.
| | |
|---|---|
| *B01L 1/04* | (2006.01) |
| *H01L 21/67* | (2006.01) |
| *F24F 3/167* | (2021.01) |

(52) U.S. Cl.
CPC ........ *H01L 21/67017* (2013.01); *F24F 3/167* (2021.01); *H01L 21/67098* (2013.01)

(58) Field of Classification Search
CPC ............................................... H01L 21/67017
See application file for complete search history.

(56) References Cited

U.S. PATENT DOCUMENTS

| | | | | |
|---|---|---|---|---|
| 5,642,978 | A * | 7/1997 | Lahne ............... | H01L 21/67265 414/416.03 |
| 6,491,881 | B2 * | 12/2002 | Fryer ........................ | A61L 2/28 436/1 |
| 2002/0182447 | A1 * | 12/2002 | Bellido-Gonzales ........................ | C23C 14/0623 427/527 |
| 2012/0003497 | A1 * | 1/2012 | Handy .................... | G01B 11/16 118/712 |
| 2013/0202387 | A1 * | 8/2013 | Hiroki ............... | H01L 21/67184 414/217 |
| 2014/0251204 | A1 * | 9/2014 | Najmaei .................. | C30B 25/04 117/88 |
| 2014/0353166 | A1 * | 12/2014 | Iezzi ...................... | B01J 35/004 502/220 |
| 2015/0111392 | A1 * | 4/2015 | Ishii .................... | H01L 21/0262 438/758 |

(Continued)

FOREIGN PATENT DOCUMENTS

| | | |
|---|---|---|
| JP | H10-097962 A | 4/1998 |
| JP | H11-150057 A | 6/1999 |

(Continued)

*Primary Examiner* — Caleb E Henry
(74) *Attorney, Agent, or Firm* — Nath, Goldberg & Meyer; Jerald L. Meyer; Tanya E. Harkins (57) ABSTRACT

There is provided a processing apparatus including: a processing part including a plurality of process modules connected to each other in a first room, and a loader module provided in the first room and accommodating a carrier which receives a substrate processed by each of the plurality of process modules; and a plurality of pump units corresponding to the plurality of process modules, respectively, and arranged in a second room adjacent to the first room, wherein an installation area of the plurality of pump units is equal to or smaller than that of the processing part.

15 Claims, 8 Drawing Sheets

(56) References Cited

U.S. PATENT DOCUMENTS

| | | | | |
|---|---|---|---|---|
| 2015/0118487 A1* | 4/2015 | Wolden | ............... | C03C 17/3464 |
| | | | | 204/192.15 |
| 2015/0345010 A1* | 12/2015 | Muratore | ............ | C23C 14/0623 |
| | | | | 204/192.15 |
| 2016/0093491 A1* | 3/2016 | Choi | ................ | H01L 29/78681 |
| | | | | 438/479 |
| 2016/0240719 A1* | 8/2016 | Lin | ................... | H01L 21/02485 |

FOREIGN PATENT DOCUMENTS

| | | |
|---|---|---|
| JP | H11-204449 A | 7/1999 |
| WO | 2018/003072 A1 | 1/2018 |

\* cited by examiner

PROCESSING APPARATUS

CROSS-REFERENCE TO RELATED APPLICATION

This application is based upon and claims the benefit of priority from Japanese Patent Application No. 2019-002944, filed on Jan. 10, 2019, the entire contents of which are incorporated herein by reference.

TECHNICAL FIELD

The present disclosure relates to a processing apparatus.

BACKGROUND

There has been known a processing system that facilitates effective use of a room having a high degree of cleanliness and that reduces processing costs by separately installing a utility box or a pump box from a clean room and the like (see, for example, Patent Document 1).

PRIOR ART DOCUMENT

Patent Document

Patent Document 1: Japanese Laid-Open Patent Publication No. H10-097962

SUMMARY

According to an embodiment of the present disclosure, there is provided a processing apparatus including: a processing part including a plurality of process modules connected to each other in a first room, and a loader module provided in the first room and accommodating a carrier which receives a substrate processed by each of the plurality of process modules; and a plurality of pump units corresponding to the plurality of process modules, respectively, and arranged in a second room adjacent to the first room, wherein an installation area of the plurality of pump units is equal to or smaller than that of the processing part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, non-limiting exemplary embodiments of the present disclosure will be described with reference to the accompanying drawings. In all the accompanying drawings, the same or corresponding members or components will be denoted by the same or corresponding reference numerals, and redundant explanations thereof will be omitted.

First Embodiment

Figure 1:
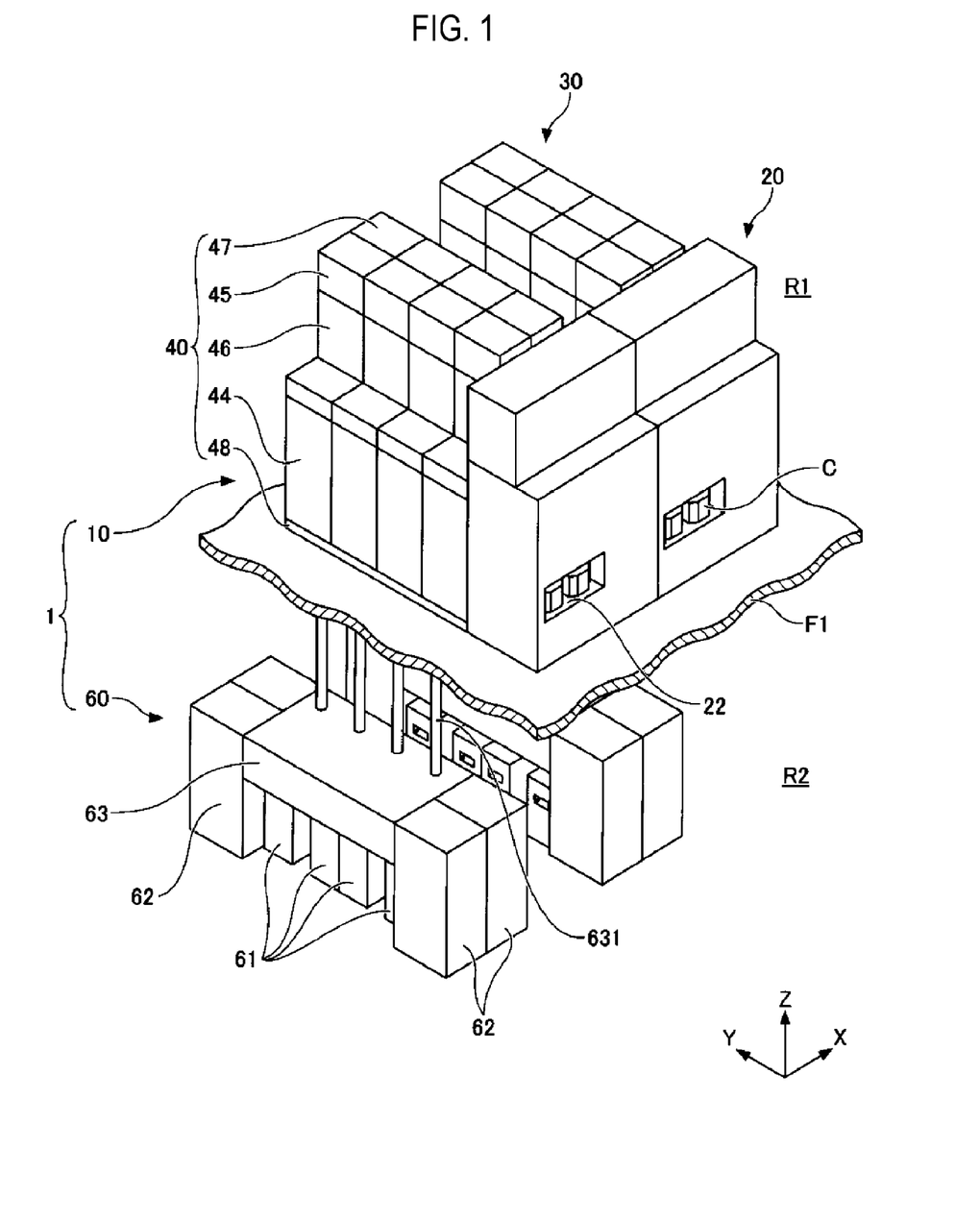
FIG. 1 is a perspective view illustrating an exemplary configuration of a processing apparatus of a first embodiment.
Figure 2:
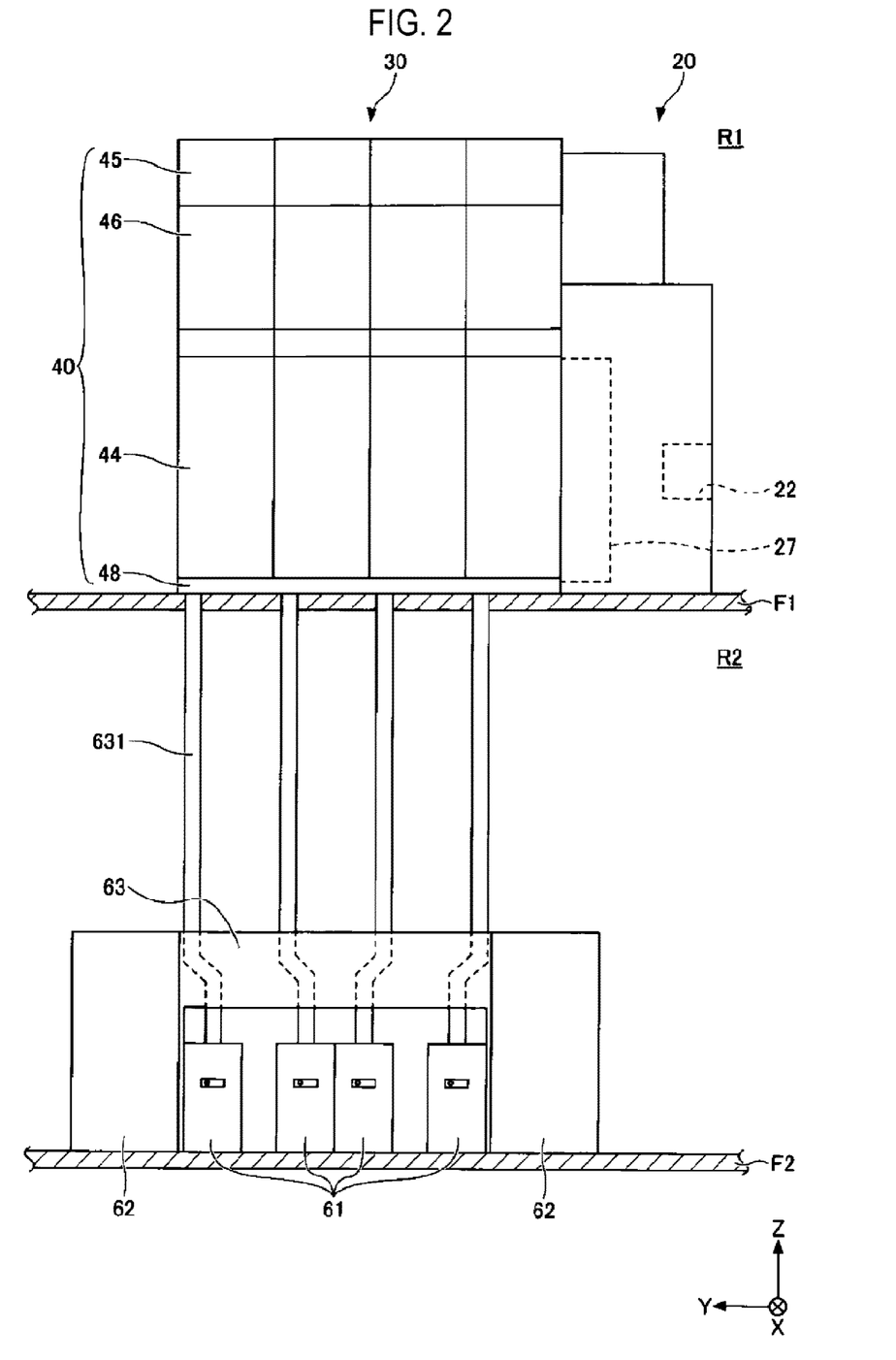
FIG. 2 is a side view of the processing apparatus of FIG. 1.
Figure 3:
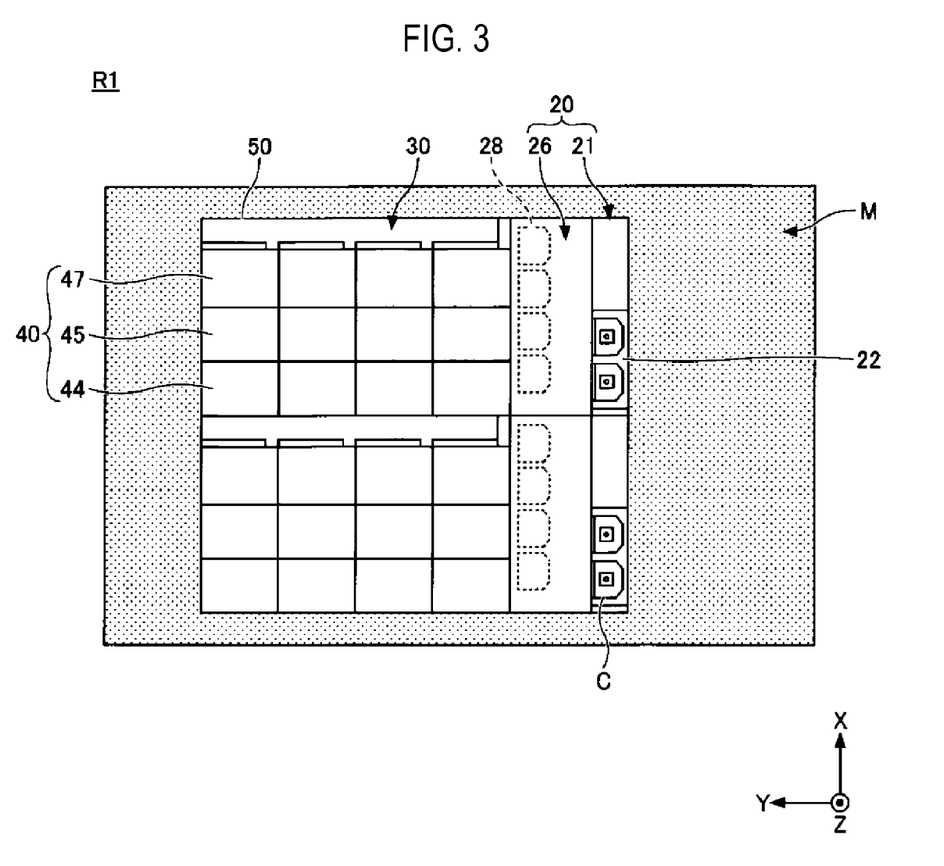
FIG. 3 is a plan view of the processing apparatus of FIG. 1.
Figure 4:
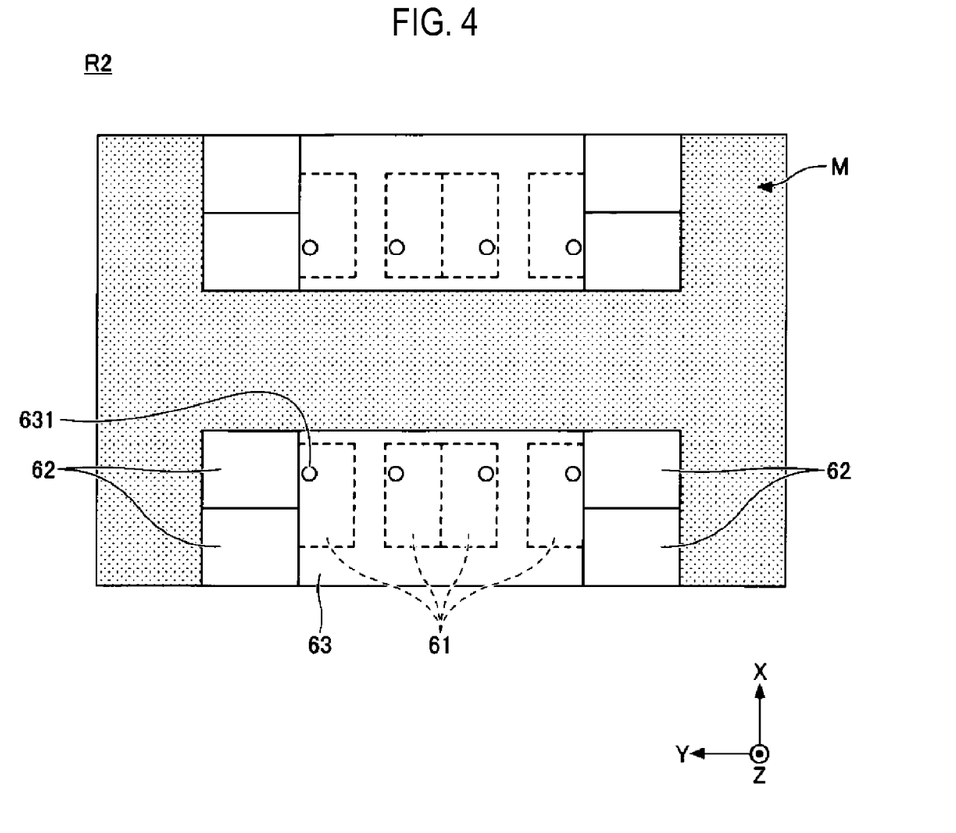
FIG. 4 is another plan view of the processing apparatus of FIG. 1.

A processing apparatus according to a first embodiment will be described. FIG. 1 is a perspective view illustrating an exemplary configuration of the processing apparatus according to the first embodiment. FIG. 2 is a side view of the processing apparatus of FIG. 1. FIGS. 3 and 4 are plan views of the processing apparatus of FIG. 1 with FIG. 3 being a plan view of a processing part provided in a first room and FIG. 4 being a plan view of an exhaust unit provided in a second room below the first room. Further, a region M in FIG. 3 is a region for maintenance, a region for loading a carrier C, and the like. In addition, a region M in FIG. 4 is a region for maintenance of pump units 61, connection pipes 631, and the like. In the following description, a left-right direction, a front-rear direction, and a height direction of the processing apparatus are referred to as an X direction, a Y direction, and a Z direction, respectively.

In FIGS. 1 to 4, although a case in which two processing apparatuses are described to be arranged adjacent to each other, a single processing apparatus may be arranged, or three or more processing apparatuses may be arranged. Hereinafter, a processing apparatus 1 disposed at one side will be described as an example. Further, the processing apparatus disposed at the other side may have the same configuration as that of the processing apparatus 1 disposed at the one side.

As illustrated in FIGS. 1 to 4, the processing apparatus 1 includes a processing part 10 and an exhaust part 60.

The processing part 10 is disposed in a first room R1. The first room R1 is, for example, a clean room. The processing part 10 includes a loader module 20 and a processing module 30.

The loader module 20 is installed on a floor F1 of the first room R1. The interior of the loader module 20 is kept, for example, in an air atmosphere. The loader module 20 is a region in which the carrier C receiving a semiconductor wafer as an example of a substrate (hereinafter, referred to as a wafer W) is transferred between components (to be described later) in the processing apparatus 1, is loaded into the processing apparatus 1 from the outside, or is unloaded to the outside from the processing apparatus 1. The carrier C may be, for example, a front-opening unified pod (FOUP). The loader module 20 includes a first transfer part 21 and a second transfer part 26 positioned behind the first transfer part 21.

As an example, two load ports 22 are provided at left and right sides of the first transfer part 21. Each load port 22 is a stage which receives the carrier C when the carrier C is loaded into the processing apparatus 1. The load ports 22 are provided in a location where a wall of a housing is opened to allow access to the processing part 10 from the outside.

FIMS ports 27 are disposed in the second transfer part 26. For example, two FIMS ports 27 are arranged up and down. Each of the FIMS port 27 is a holding table which holds the carrier C when the wafer W in the carrier C is loaded into or unloaded from a heat treatment furnace 411 (to be described later) in the processing module 30. The FIMS port 27 is movable in the front-rear direction. In addition, the second transfer part 26 is provided with one or more stockers 28 which store the carriers C.

A carrier transfer mechanism (not illustrated), which transfers the carrier C among the load ports 22, the stockers 28, and the FIMS ports 27, is disposed between the first transfer part 21 and the second transfer part 26.

The processing module 30 is a module which takes out the wafer W from the carrier C and performs various processes on the wafer W. The interior of the processing module 30 is kept in an inert gas atmosphere, for example, a nitrogen gas atmosphere, to prevent formation of an oxide film on the wafer W. The processing module 30 includes four process modules 40 and a wafer transfer module 50.

Figure 5:
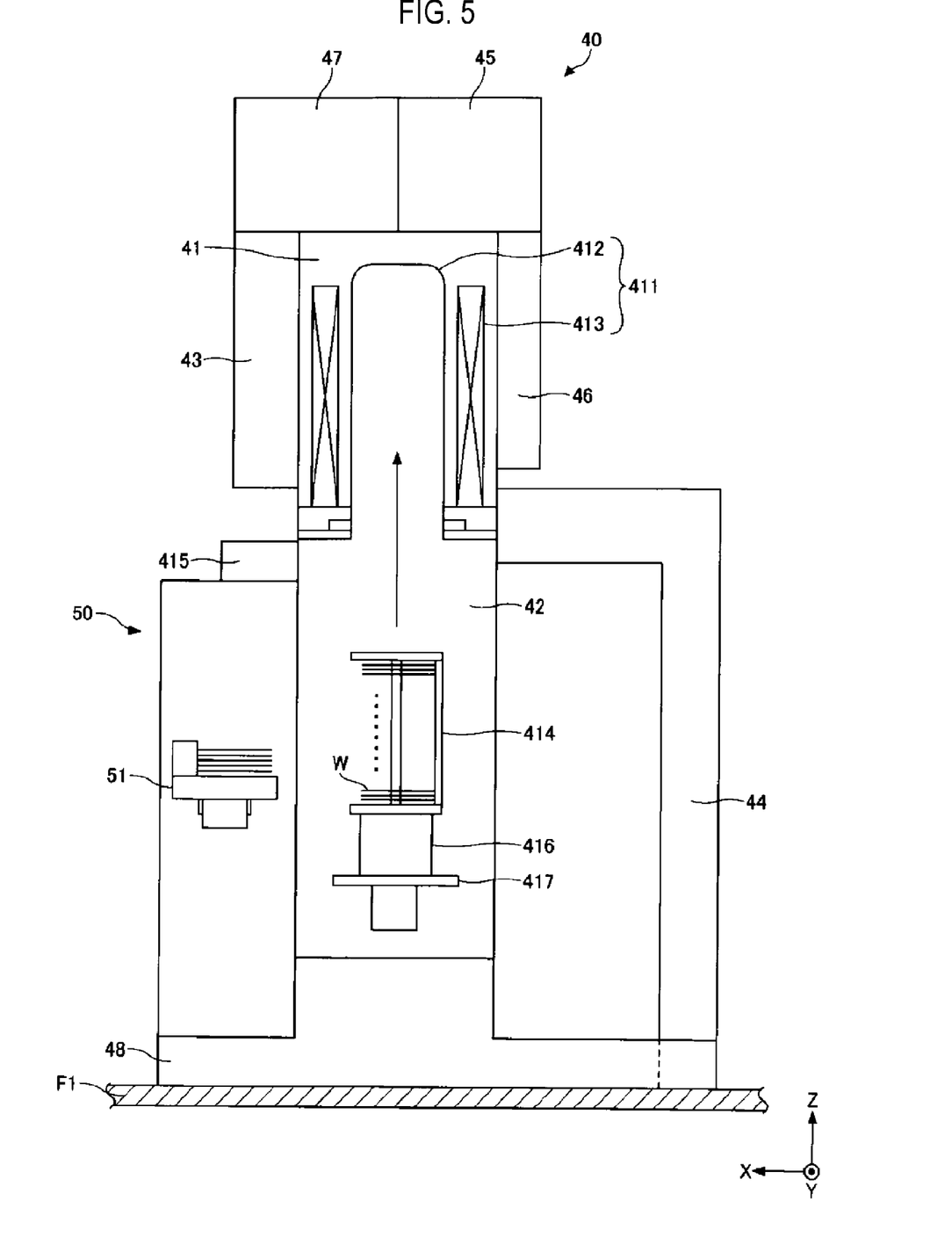
FIG. 5 is a schematic diagram for explaining a process module provided in the processing apparatus of FIG. 1.

The process modules 40 are connected and disposed in the front-rear direction. FIG. 5 is a schematic diagram for explaining the process modules 40 provided in the processing apparatus 1 of FIG. 1, and illustrates the processing part 10 of FIG. 1 as viewed from the rear side.

As illustrated in FIG. 5, each of the process modules 40 includes a heat treatment unit 41, a load unit 42, a gas supply unit 43, an exhaust duct 44, an RCU unit 45, a branching duct 46, a control unit 47, and a floor box 48.

The heat treatment unit 41 is a unit which accommodates multiple sheets (for example, 50 to 150) of wafers W and performs a predetermined heat treatment on the wafers W. The heat treatment unit 41 includes the heat treatment furnace 411. The heat treatment furnace 411 includes a processing container 412 and a heater 413. The processing container 412 accommodates a wafer boat 414. The wafer boat 414 has a cylindrical shape formed of, for example, quartz, and holds the multiple sheets of wafers W in multiple stages. The heater 413 is provided around the processing container 412 and has, for example, a cylindrical shape. The heater 413 heats the wafers W received in the processing container 412. A shutter 415 is provided below the processing container 412. The shutter 415 is a door for covering a lower end of the heat treatment furnace 411 as a lid while the wafer boat 414 is unloaded from the heat treatment furnace 411 and a next wafer boat 414 is loaded into the heat treatment furnace 411.

The load unit 42 is provided below the heat treatment unit 41 and is installed on the floor F1 of the first room R1 via the floor box 48. In the load unit 42, the wafer boat 414 is placed on a cover 417 via a heat insulating container 416. The wafer boat 414 is formed of a heat-resistant material, such as quartz or silicon carbide, and holds the wafers W in a substantially horizontal posture at a predetermined interval in the vertical direction. The cover 417 is supported by an elevating mechanism (not illustrated). The wafer boat 414 is loaded into or unloaded from the processing container 412 by the elevating mechanism. In addition, the load unit 42 also functions as a space for cooling down the wafers W processed in the heat treatment unit 41.

The gas supply unit 43 is disposed on a lateral surface of the heat treatment unit 41 to be spaced apart from the floor F1. The gas supply unit 43 includes a pressure regulator, a mass flow controller, a valve, and the like, which are configured to supply a processing gas or a purge gas at a predetermined flow rate into the processing container 412.

The exhaust duct 44 is disposed to face the gas supply unit 43 with the heat treatment unit 41 disposed therebetween. The exhaust duct 44 includes an exhaust pipe which connects the interior of the processing container 412 and a vacuum pump (to be described later), a pipe heater which heats the exhaust pipe, and the like.

The RCU unit 45 is disposed in a ceiling portion of the heat treatment unit 41. The RCU unit 45 is a unit which produces a refrigerant to be supplied to the branching duct 46, and includes a heat exchanger, a blower, a valve, a pipe, and the like.

The branching duct 46 is provided on a lateral surface of the heat treatment unit 41, for example, at a location facing the gas supply unit 43 via the heat treatment unit 41. The branching duct 46 branches the refrigerant provided from the RCU unit 45 and supplies the same into a space between the processing container 412 and the heater 413. Accordingly, the processing container 412 can be cooled down in a short period of time.

The control unit 47 is disposed in the ceiling portion of the heat treatment unit 41. The control unit 47 includes a control device and the like which control the operation of each part of the process module 40. The control device controls, for example, the operation of the gas supply unit 43 to adjust the flow rate of the processing gas or the purge gas supplied into the processing container 412.

The wafer transfer module 50 is provided common to the plurality of process modules 40. The wafer transfer module 50 is disposed over one side surface of the plurality of process modules 40 and is installed on the floor F1 of the first room R1 via the floor box 48. The wafer transfer module 50 is provided with a wafer transfer mechanism 51. The wafer transfer mechanism 51 transfers the wafers W between the carrier C placed on the FIMS port 27 and the wafer boat 414 loaded into the load unit 42 of the process module 40. The wafer transfer mechanism 51 includes, for example, a plurality of forks, and can transfer and load the multiple sheets of wafers W at once. This makes it possible to shorten the time required to transfer the wafers W. However, there may be only a single fork.

As described above, the processing part 10 is provided with the plurality of process modules 40 for one loader module 20. As a result, an installation area of the processing part 10 can be made smaller than that in a case in which one process module 40 is provided for one loader module 20. This improves the productivity per unit area.

The exhaust part 60 is disposed in a second room R2 adjacent to the first room R1. The second room R2 is located, for example, below the first room R1. An installation area of the exhaust part 60 is equal to or smaller than that of the processing part 10. The exhaust part 60 includes a plurality of pump units 61, a plurality of exhaust gas treatment devices 62, and a storage cabinet 63.

The pump units 61 are provided to correspond to the four process modules 40 of the processing part 10, respectively, and are installed on a floor F2 of the second room R2. The plurality of pump units 61 are arranged to be aligned in the same direction as the plurality of process modules 40. That is, the plurality of pump units 61 are arranged by being aligned in the front-rear direction. In the illustrated example, among the plurality of pump units 61, the pump units 61 disposed at the central side are connected to each other, and the pump units 61 adjacent on both sides of the central pump units 61 are arranged at a predetermined interval from the central pump units 61, respectively. Each of the plurality of pump units 61 includes a vacuum pump. Although the type of the vacuum pump is not particularly limited, for example, a pump in which a dry pump and a mechanical booster pump are combined with each other can be used.

The exhaust gas treatment devices 62 are arranged to face each other with the plurality of pump units 61 disposed therebetween, and are installed on the floor F2 of the second room R2. The plurality of exhaust gas treatment devices 62 detoxify gas exhausted from the process modules 40 by the respective pump units 61.

The storage cabinet 63 is provided above the pump units 61. The storage cabinet 63 may be formed, for example, in a watchtower shape, and the plurality of pump units 61 are arranged in an inner space of the storage cabinet 63. As such, since the plurality of pump units 61 is installed in the inner space of the storage cabinet 63, an area required to install the plurality of pump units 61 and the storage cabinet 63 can be reduced, as compared with a case in which the storage cabinet 63 is placed on a floor. In addition, since a space may be created around the plurality of pump units 61, replacement or maintenance of the vacuum pump becomes easy. Further, the watchtower shape means a state in which a plurality of pillars are installed upright on the floor F2 and upper portions of the plurality of pillars are connected to each other by a member to be supported, so that the member is supported at a location higher than a surface of the floor.

Further, the storage cabinet 63 may be fixed, for example, to the exhaust gas treatment devices 62 and thus may be supported on the pump units 61. Even in this case, the area required to install the plurality of pump units 61 and the storage cabinet 63 can be reduced as compared with a case in which the storage cabinet 63 is placed on the floor. Further, a space may be created around the plurality of pump units 61, so that the replacement or maintenance of the vacuum pump becomes easy.

The storage cabinet 63 receives a portion of the connection pipe 631 that connects an exhaust pipe of each exhaust duct 44 and the vacuum pump of each pump unit 61 corresponding to the respective exhaust duct 44. The connection pipes 631 that connect the plurality of process modules 40 and the plurality of respective pump units 61 may be equal to each other in length. As a result, in the plurality of process modules 40, the processing containers 412 and the vacuum pumps of the pump units 61 are identical to or substantially identical to each other in conductance. Therefore, an instrument error between the plurality of process modules 40 can be reduced.

In addition, the storage cabinet 63 receives a dilution gas pipe (not illustrated). The dilution gas pipe is connected to the middle of the connection pipe 631 and introduces a dilution gas into the connection pipe 631 to dilute an exhaust gas flowing through the connection pipe 631. Further, the storage cabinet 63 stores a pipe (not illustrated) which connects the vacuum pump of each pump unit 61 and each exhaust gas treatment device 62.

As described above, according to the processing apparatus 1 of the first embodiment, the processing part 10 including the plurality of process modules 40 connected to each other is disposed in the first room R1. In addition, the plurality of pump units 61 corresponding to the plurality of process modules 40 are arranged in the second room R2 adjacent to the first room R1. Further, the installation area of the plurality of pump units 61 is equal to or smaller than that of the processing part 10. As a result, a footprint of the processing apparatus 1 having the plurality of process modules 40 can be reduced.

Second Embodiment

Figure 6:
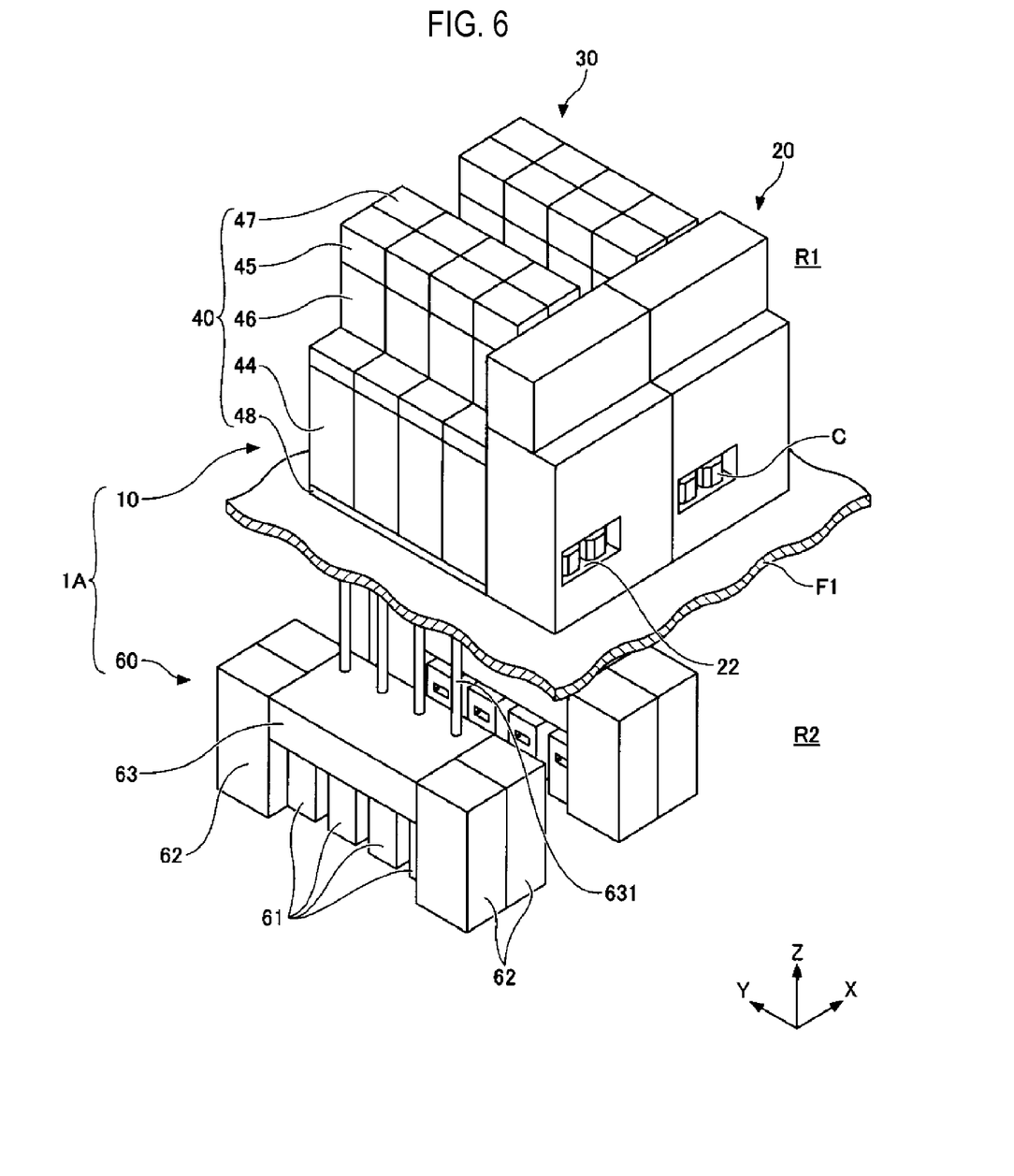
FIG. 6 is a perspective view illustrating an exemplary configuration of a processing apparatus according to a second embodiment.
Figure 7:
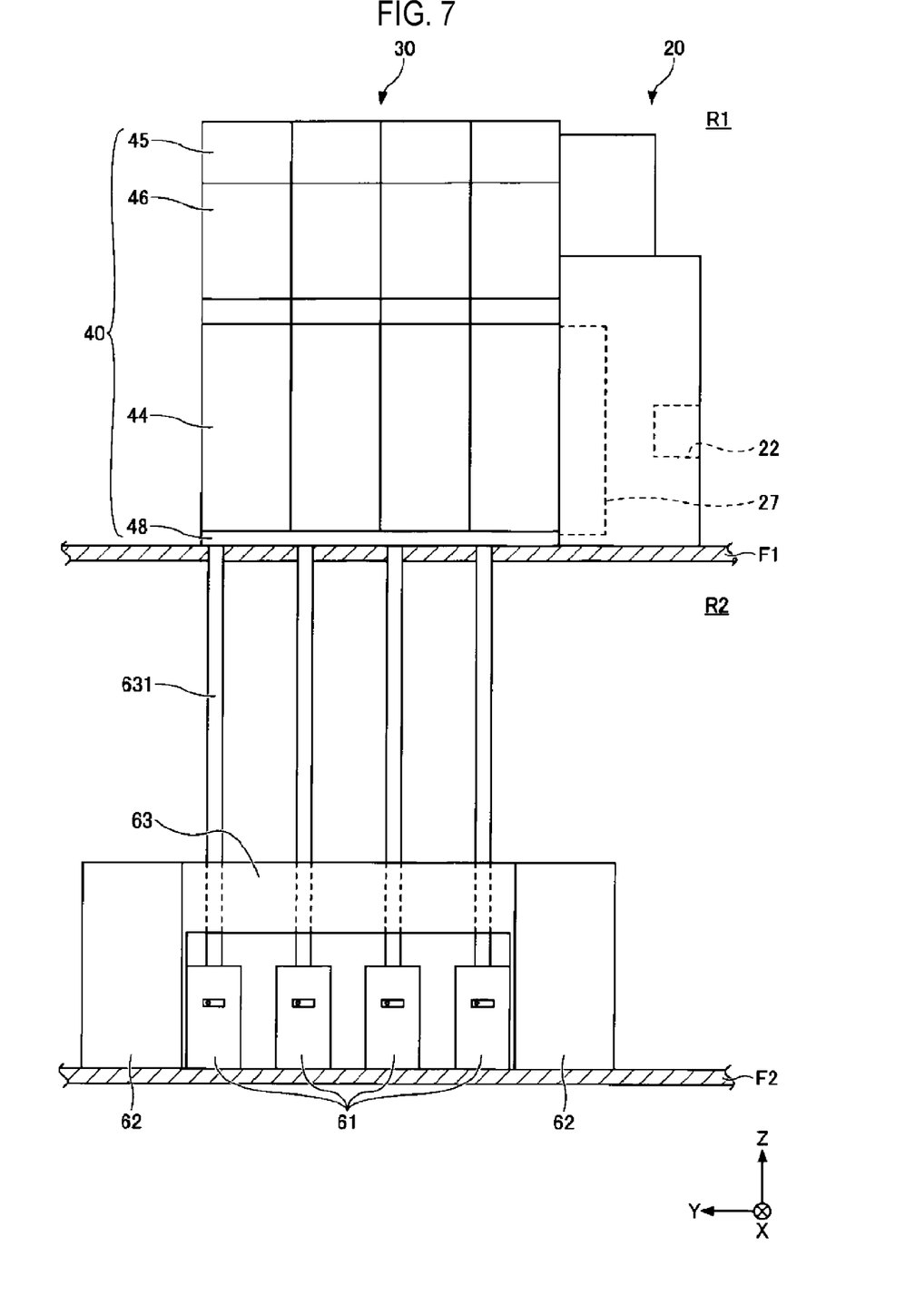
FIG. 7 is a side view of the processing apparatus of FIG. 6.
Figure 8:
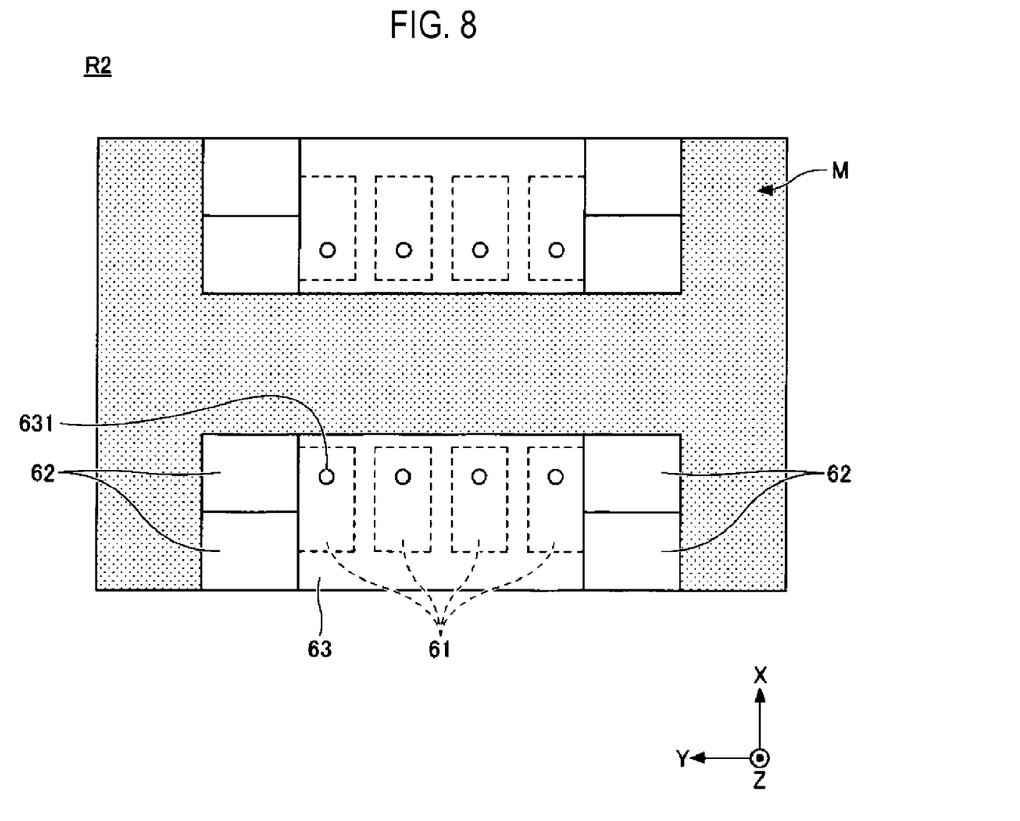
FIG. 8 is a plan view of the processing apparatus of FIG. 6.

A processing apparatus of a second embodiment will be described. FIG. 6 is a perspective view illustrating an exemplary configuration of the processing apparatus of the second embodiment. FIG. 7 is a side view of the processing apparatus of FIG. 6. FIG. 8 is a plan view of the processing apparatus of FIG. 6, and is a plan view of an exhaust unit arranged in a second room below a first room. In addition, a region M in FIG. 8 is a region for maintenance of the pump units 61, connection pipes 631, and the like. In the following description, the left-right direction, the front-rear direction, and the height direction of the processing apparatus are referred to as an X direction, a Y direction, and a Z direction, respectively.

Although FIGS. 6 to 8 illustrate a case in which two processing apparatuses are arranged adjacent to each other, one processing apparatus may be arranged alone, or three or more processing apparatuses may be arranged. Hereinafter, a processing apparatus 1A disposed at one side will be described as an example. Further, the processing apparatus disposed at the other side may have the same configuration as that of the processing apparatus 1 disposed at the one side.

As illustrated in FIGS. 6 to 8, the processing apparatus 1A is different from the processing apparatus 1 of the first embodiment in that each of the pump units 61 of the exhaust part 60 is arranged to be spaced apart with respect to an adjacent pump unit 61. Further, the processing apparatus 1A may have the same configuration as the processing apparatus 1 of the first embodiment, with regard to the other points.

According to the processing apparatus 1A of the second embodiment, a processing part 10 including the plurality of process modules 40 connected to each other is provided in the first room R1 in the same manner as in the processing apparatus 1 of the first embodiment. Further, the plurality of pump units 61 corresponding to the plurality of process modules 40 are arranged in the second room R2 adjacent to the first room R1. In addition, the plurality of pump units 61 is equal to or smaller than the processing part 10 in installation area. As a result, a footprint of the processing apparatus 1A having the plurality of process modules 40 can be reduced.

Further, according to the processing apparatus 1A of the second embodiment, each of the plurality of pump units 61 is arranged to be spaced apart with respect to an adjacent pump unit 61. As a result, a space for replacement, maintenance, and like of the pump units 61 can be sufficiently secured.

According to the present disclosure, a footprint of a processing apparatus having a plurality of process modules can be reduced.

It should be noted that the embodiments disclosed herein are exemplary in all respects and are not restrictive. The above-described embodiments may be omitted, replaced or modified in various forms without departing from the scope and spirit of the appended claims.

In the above embodiments, while the case in which four process modules 40 has been described to be connected to each other, the number of the process modules 40 is not limited thereto. For example, two or three process modules 40 may be connected to each other, and five or more process modules 40 may also be connected to each other.

What is claimed is:

1. A processing apparatus comprising:
   a processing part including a plurality of process modules connected to each other in a first room, and a loader module provided in the first room and accommodating a carrier which receives a substrate processed by each of the plurality of process modules; and
   a plurality of pump units corresponding to the plurality of process modules, respectively, and arranged in a second room adjacent to the first room, wherein an installation area of the plurality of pump units is equal to or smaller than that of the processing part.

2. The processing apparatus of claim 1, wherein the second room is located below the first room.

3. The processing apparatus of claim 2, wherein the plurality of pump units are arranged in the same direction as an arrangement direction of the plurality of process modules.

4. The processing apparatus of claim 3, further comprising: a plurality of exhaust gas treatment devices corresponding to the plurality of pump units, respectively, and arranged in the second room,
wherein a total installation area of the plurality of pump units and the plurality of exhaust gas treatment devices is equal to or smaller than the installation area of the processing part.

5. The processing apparatus of claim 4, further comprising: a storage cabinet disposed above the plurality of pump units in the second room and configured to receive a portion of each of connection pipes which connect the plurality of pump units to the plurality of process modules corresponding to the plurality of pump units, respectively.

6. The processing apparatus of claim 5, wherein the storage cabinet is formed in a watchtower shape, and the plurality of pump units are arranged in an inner space of the storage cabinet.

7. The processing apparatus of claim 6, wherein the connection pipes which connect the plurality of pump units and the plurality of process modules corresponding respectively to the plurality of pump units are identical to each other in length.

8. The processing apparatus of claim 7, at least two of the plurality of pump units are arranged adjacent to each other.

9. The processing apparatus of claim 8, wherein each of the plurality of pump units is arranged to be spaced apart with respect to an adjacent pump unit.

10. The processing apparatus of claim 5, wherein the storage cabinet is fixed to the plurality of exhaust gas treatment devices.

11. The processing apparatus of claim 5, wherein the connection pipes which connect the plurality of pump units and the plurality of process modules corresponding respectively to the plurality of pump units are identical to each other in length.

12. The processing apparatus of claim 1, wherein the plurality of pump units are arranged in the same direction as an arrangement direction of the plurality of process modules.

13. The processing apparatus of claim 1, further comprising: a plurality of exhaust gas treatment devices corresponding to the plurality of pump units, respectively, and arranged in the second room,
wherein a total installation area of the plurality of pump units and the plurality of exhaust gas treatment devices is equal to or smaller than the installation area of the processing part.

14. The processing apparatus of claim 1, at least two of the plurality of pump units are arranged adjacent to each other.

15. The processing apparatus of claim 1, wherein each of the plurality of pump units is arranged to be spaced apart with respect to an adjacent pump unit.

* * * * *